United States Patent [19]

Hovel et al.

[11] Patent Number: 4,766,093
[45] Date of Patent: Aug. 23, 1988

[54] CHEMICALLY FORMED SELF-ALIGNED STRUCTURE AND WAVE GUIDE

[75] Inventors: Harold J. Hovel, Katonah; Thomas F. Kuech, Ossining, both of N.Y.

[73] Assignee: International Business Machines Corp., New York, N.Y.

[21] Appl. No.: 62,332

[22] Filed: Jun. 9, 1987

Related U.S. Application Data

[63] Continuation of Ser. No. 635,975, Jul. 30, 1984, abandoned.

[51] Int. Cl.[4] .................................... H01L 21/20
[52] U.S. Cl. .................................... 437/129; 437/228; 437/238; 350/96.12; 156/628
[58] Field of Search ............... 437/129, 235, 238, 239, 437/240, 228; 156/628, 652, 653, 656, 657; 350/96.11, 96.12

[56] References Cited

U.S. PATENT DOCUMENTS

| 3,820,871 | 6/1974 | Croset et al. ............ 350/96 WG |
| 3,883,219 | 5/1975 | Logan et al. ............ 350/96.11 |
| 3,900,944 | 8/1975 | Fuller et al. . |
| 3,965,279 | 6/1976 | Levinstein et al. . |
| 4,333,226 | 6/1982 | Abe et al. . |
| 4,497,107 | 2/1985 | Cogan ............ 29/579 |
| 4,597,003 | 6/1986 | Aine et al. ............ 156/628 |
| 4,652,334 | 3/1987 | Jain et al. ............ 156/628 |

FOREIGN PATENT DOCUMENTS

| 37647 | 4/1981 | Japan ............ 427/88 |
| 56-79486 | 6/1981 | Japan . |
| 10234 | 1/1982 | Japan ............ 156/628 |
| 98932 | 6/1983 | Japan ............ 156/628 |
| 976559 | 8/1963 | United Kingdom . |

OTHER PUBLICATIONS

Abbas et al, "Doped Polycrystalline Field Shield Process", IBM Tech. Disc. Bulletin.
Ghondi, VLSI Fabrication Principles, John Wiley & Sons, 1983, N.Y., pp. 437–439, 453–461.
IBM Technical Disclosure Bulletin, vol. 25, No. 11B, Apr. 1983, E. Bassous, et al.

Primary Examiner—Brian E. Hearn
Assistant Examiner—Kevin McAndrews
Attorney, Agent, or Firm—Scully, Scott, Murphy & Presser

[57] ABSTRACT

The formation of a self-aligned semiconductor structure in a semiconductor substrate is described by providing a first and a second layer or a wave guide of different chemical composition above said semiconductor substrate, said second layer providing a shape defining opening permitting chemical conversion of said first layer adjacent said substrate to a third chemical composition different from said first and second layers. The third chemical composition is removed with a reagent that reacts only with said third composition and not with said first and second layers for the manufacture of self-aligned semiconductor structures. The third chemical composition is retained in the formation of a wave guide and has an index of refraction different from the first layer.

15 Claims, 1 Drawing Sheet

CHEMICALLY FORMED SELF-ALIGNED STRUCTURE AND WAVE GUIDE

This application is a continuation of application Ser. No. 635,975 filed July 30, 1984, now abandoned.

TECHNICAL FIELD

The invention relates to chemically formed self-aligned semiconductor devices and wave guides on semi-conductor devices.

PRIOR ART

Self-aligned semiconductor devices are known in the prior art and have been prepared by methods that are now considered conventional. Self-alignment generally refers to the positioning of source and drain electrodes next to a gate electrode in a FET device. The self-alignment technique was developed in order to position electrodes relatively close to the gate to avoid high resistance between the electrode and the gate. The resistance between the source electrode and the gate is called the source resistance whereas the resistance between the drain electrode and the gate is called the drain resistance. Although other factors influence source resistance and drain resistance, the distance between the source and drain electrodes and the gate is the most critical factor. When the source resistance and/or the drain resistance is too high, the performance of the FET device may be seriously impaired. The prior art self-alignment technique was achieved by depositing an electrode layer on a substrate and positioning a second layer over the electrode layer, providing an opening in the second layer and etching the first layer through the opening. The etching compound is selected to remove the first layer and not the second layer thereby undercutting the second layer. Since the etching step is followed by the deposition of a material through the opening to form a gate on the substrate and the gate material does not spread out beyond the edges of the opening through which it is deposited, the degree of undercutting (i.e., the degree of removal of the first layer under the second layer) determines the distance of the first layer from the gate or stated otherwise the positioning of the source or drain electrodes with respect to the gate. This procedure is what is known in the art as self-alignment and is relatively more precise than mechanical methods for placing a source and/or drain electrode next to a gate.

Mechanical methods for aligning the electrodes are known and involve for example masking the semiconductor device and depositing the electrodes and/or the gate through an opening in the mask which is difficult because alignment of the openings in the mask is done mechanically and calls for extremely high precision and close tolerances for the constructions of semiconductor devices and especially microcircuits.

Self-aligning methods of the prior art permit separation of elements (e.g., source and drain electrodes relative to a gate electrode in a FET) of fairly close tolerances. Even though this permits construction of microelectronic circuits, it is still desirable to position semiconductor device elements even closer to reduce the resistance between them as for example the source resistance or the drain resistance in a FET.

It would therefore be desirable to provide a method that would allow this type of positioning especially positioning of elements within several thousand Angstroms of one another which is not possible with the self-aligning procedures of the prior art. Self-alignment structures that can be built within these tolerances would provide for the construction of even smaller semiconductor devices than can be made with the prior art methods.

One of the difficulties with the methods presently employed for the construction of self-aligned structures is that an acid etching step is generally used to remove the first layer to provide the opening to the substrate and the acid may remove other elements of the circuit that are to be retained unless etching is properly controlled. Acid etching is difficult to control, however. Additionally, the acids that are commonly employed to remove electrodes may also attack the substrate. The removal of the electrode materials by chemical means such as acid etching according to the prior art process has to be carefully controlled so that the degree of removal of the first layer and consequent undercutting of the second layer is not done to any great extreme not only because of the problems of removing other elements in the microcircuit but also because excess removal of the first layer or electrode material will increase the distance between the electrode and the gate subsequently formed on the device and the source resistance or the drain resistance of the device would be too high due to the excessive distance between the electrodes and the gate.

The utilization of light as a signal transfer means for the transmission and processing of information has been significantly developed over the past years. Fiber optic and light emitting units (e.g. lasers) have been developed, that, in combination with microcircuits, transfer and process information. These microcircuits require means or wave guides for receiving and/or transmitting light signals transmitted through fibers or by lasers which are not easily provided because of the size of the microcircuit. Stated otherwise the delivery of such light signals to various parts of the microcircuit is difficult because of the relatively small size of such circuits compared to the systems used for the transmission of these light signals.

Accordingly, it is an object of this invention to overcome these and other difficulties and to provide a novel method for the manufacture of a self-aligned circuit.

It is also an object of the present invention to provide such a method for the manufacture of self-aligned circuits that does not rely on etching by the conventional prior art methods.

It is a further object of the present invention to provide a reagent and a layer that can be removed by such reagent that does not also dissolve other critical elements in a microcircuit device and which reagent and layer can be used in a self-alignment method for the manufacture of self-aligned circuits.

It is also an object of this invention to provide novel wave guide apparatus and a method for making such wave guide apparatus.

It is also an object of the present invention to provide such novel wave guide apparatus and a method for the manufacture of such wave guide apparatus for conducting light signals in microcircuit devices.

These and other objects have been achieved by the present invention which will be understood in greater detail by reference to the attached drawings and the specification and claims that follow.

SUMMARY OF THE INVENTION

The present invention relates to a self-aligned semiconductor device made by depositing a conductor on a semiconductor substrate and a layer over the conductor. The layer is opened in a region of the substrate on which an additional element is to be placed such as a gate for a field effect transistor (FET). The conductor is then chemically converted through the opening in the region to a compound that is removed by a reagent that does not remove the conductor. An element is then applied to the surface of the substrate through the opening. Self alignment is obtained by converting the conductor into a compound to a sufficient degree from the edge of the opening so that a controlled amount of undercutting of the layer is provided when the compound is subsequently removed. When the element is applied to the surface of the substrate through the opening, such as the application of a gate for a FET, the edge of the conductor is separated from the element that is deposited through the opening but yet close enough to minimize any electrical resistance between the conductor and the element deposited through the opening. The layer may be any conducting material which is not chemically converted when the conversion of the underlying conductor into the compound is carried out.

In a specific example a germanium conductor is placed on top of a semiconductor substrate and a gold, molybdenum or palladium layer placed over the germanium. The gold, molybdenum or palladium layer is opened and the germanium underlying the opening is converted to germanium oxide to a measured extent beyond the edge of the opening. The germanium oxide is then removed by water or hydrogen chloride or a plasma after which a gate e.g. an electrode such as aluminum is deposited through the opening on the surface of the semiconductor substrate.

By chemically converting the conductor into a compound that is readily removed by the reagent a high degree of control is possible in placing the conductor in a position next to an element deposited on the semiconductor substrate such as a gate.

Control of the chemical conversion of the conductor is generally more precise and less difficult than the prior art etching methods which were employed to remove the conductor. Additionally, the etching reagents of the prior art tended to remove elements of the device or circuit that are to be retained.

The present invention also relates to wave guides and a method for their manufacture comprising the application of a first layer such as a germanium, silicon, aluminum, tantalum or titanium layer onto a substrate such as a semiconductor device or substrate. A second layer is placed over the first layer and an opening provided in the second layer in the shape of a wave guide. The first layer is then converted by a chemical reaction in the area below the opening to a compound conforming in shape to the opening and having an index of refraction different from the first layer. Where germanium, silicon, aluminum, tantalum and titanium may be used as the first layer, they may be chemically converted to their respective oxides.

DETAILED DESCRIPTION OF THE PREFERRED EMBODIMENT OF THE INVENTION

Figure 1:
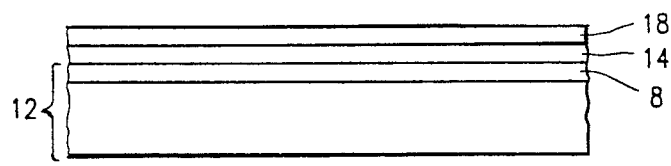
FIG. 1 comprises a side view in section of a substrate used in the manufacture of semiconductor devices having a first and second layer deposited over the substrate.
Figure 2:
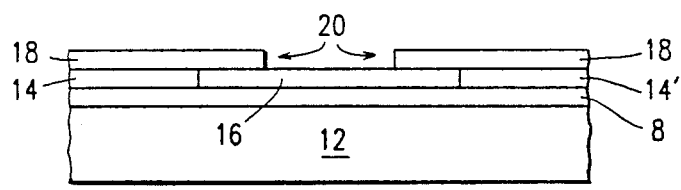
FIG. 2 comprises a side view in section of the devices illustrated in FIG. 1 further having an opening in the second layer, a section of the first layer being chemically reacted through the opening and under the second layer for the formation of a self-aligned semiconductor device.
Figure 3:
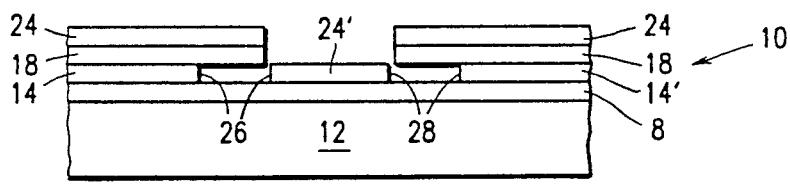
FIG. 3 comprises a side view in section of a chemically formed self-aligned semiconductor device constructed from the device illustrated in FIG. 2.

Referring to the drawings and specifically FIGS. 1, 2 and 3, a semiconductor device 10 is shown in FIG. 3 which is constructed by a method according the present invention by which a substrate 12 such as a gallium-arsenide or silicon substrate is coated with an element such as a conductor material 14, e.g., a thin layer of germanium over which a second layer 18 is placed in a region over and next adjacent to an area of placement of circuit means on the substrate 12. The substrate 12 is normally high in electrical resistance and may contain a region which is lower in electrical resistance than the substrate 12. Doped region 8 is developed by either ion implantation, diffusion or epitaxial growth techniques both of which are well known in the art. Region 8 is formed before layer 14 is placed on substrate 12. Doped region 8 is typically formed with either silicon, selenium, sulfur, tellurium or tin. The area of placement of the circuit means is defined by producing an opening such as the opening 20 in layer 18 extending over the region and formed by standard lithographic procedures for semiconductive device purposes. The layer 18 may be a photoresist layer in and of itself which may be subsequently removed or may be a material such as gold, tin, molybdenum, tungsten, palladium or equivalent material. Once the opening 20 is formed, the structure is placed in an ambient with which the exposed part of the layer 14 reacts and is thereby chemically converted below the opening 20 and in a direction outwardly from the opening 20 to a compound 16 that is removable from the device by a reagent that will remove the compound 16 at a faster rate then the layer 14 or the layer 18 by which it is meant that the reagent will have substantially minimal to no effect on the removal of the layer 14 and 18 as well as the device 10 or substrate 12. In one embodiment, the layer 14 comprises germanium and the ambient in which the device is placed comprises an oxidizing medium such as air or oxygen for the conversion of the layer 14 beneath opening 20 into a region 16 of germanium oxide. The conductor 14 is then divided into two regions 14 and 14'. Thus when germanium is used as the layer 14 it will be divided into two germanium regions 14 and 14' after conversion of the section 16 into germanium oxide as described herein above. The conversion of the layer 14 into a compound 16 is controlled for a distance extending under the layer 18 adjacent the opening 20 in a direction substantially parallel to the plane of the device 10 and within a predetermined distance from the edge of opening 20 by controlling the conditions under which the layer 14 is exposed to an ambient through the opening 20. In one example exposure of the layer 14 through the opening 20 to air and/or other oxygen sources can be effected by the pressure or the partial pressure of the oxidizing ambient, by placement of the device in an autoclave or other pressure device or by mixing the ambient with other nonreactive compounds, such as in the case of an oxidizing gas, e.g., oxygen mixed with nitrogen or a rare gas to control the partial pressure of the oxygen. Compounds consisting of oxides result from oxygen-bearing ambients, while compounds consisting of nitrides result from, say, ammonia-containing ambients with active nitrogen content. The temperature of the ambient can also be adjusted to change the reactivity thereof. Generally, by increasing the temperature and/or pressure of the ambient, the rate of reaction will increase and by reducing the temperature and/or pressure of the ambient the rate of reaction will decrease. The partial pressures may vary from anywhere from about 0.1 atmospheres to slightly less than 1 atmosphere pressure, the pressure range for the ambient, including the partial pressure ranges being anywhere from about 0.1 atmospheres to about 1,000 atmospheres. The ambient may also be ionized by methods well known in the art which increases the reaction rate and allows the reaction to proceed at lower temperatures. The time period over which the layer 14 is exposed to the ambient through the opening 20 is also a factor that will control the extent of the development of the layer 14 into a compound 16 underneath the layer 18. As the time of exposure of layer 14 through opening 20 to the ambient increases, the degree of formation of compound 16 also increases. All of these are parameters that can be adjusted by a person having ordinary skill in the art. In any event, it is critical to the present invention that the compound 16 is formed to some degree underneath the layer 18 so that subsequent removal of the compound 16 by the reagent will result in some undercutting of the layer 18 which is the essence of the present chemical self-alignment method and the devices produced thereby. Once the compound 16 is formed, to the degree and the extent determined for the production of a self-aligned semi-conductor or other device, the compound 16 is removed. In the case where layer 14 comprises germanium, the compound 16 may consist of germanium oxide which may be removed from the substrate 12 through opening 20 by means of a reagent such as water, hydrogen peroxide, hydrochloric acid or by plasma etching techniques, the latter being a process known to those with ordinary skill in the art. The plasma employed for removal of the compound 16 may comprise a plasma of a haloflouro lower alkane where the halogen compound in addition to fluorine preferably comprises chlorine such as, for example carbon tetrafluoride, monochlorotrifluoromethane, dichlorodifluoromethane, trichloromonofluoromethane and the like. After the compound 16 is removed, the substrate 12 may be converted to a semi-conductor device by deposition of a conducting material 24 through opening 20 by conventional processes. Layers 24 and 24' are the same material, are deposited simultaneously and may comprise, for example, a tungsten or aluminum layer or suitable mixtures such as tungsten-silicon or tungsten-aluminum which is placed on the semi-conductor device 10 by methods known in the art such as by vapor deposition. Upon heating the device for a time and temperature known or determinable by a person with ordinary skill in the art as for example for 1 to 5 minutes at 400° to 500° C., ohmic contact between the layer 14 and the region 8 can be formed such as in the case where layer 14 and 14' comprise germanium and the substrate 12 and region 8 comprise gallium/arsenide. In this case, a FET is formed in which, after a lead is attached to the layer 24' said layer 24' comprises a gate whereas the conductor 14 will comprise a source electrode and the conductor 14' will comprise a drain electrode. The distances 26 and 28 between layers 14 and 24' and layer 14' and 24' can be controlled within several thousand Angstroms thereby reducing the source resistance between layers 14 and 24' and the drain resistance between layers 14' and 24' to a degree not heretofore readily achieved by the prior art methods. Thus, a self-aligned structure is provided by the present invention in which semi-conductor devices can be fabricated and the components of the device can be positioned closer to one another by a method whereby the distances between components are more readily and easily controlled than previously possible.

In another embodiment of the invention, the layer 24' may comprise any circuit means for controlling power through the device 10 or its equivalents. When layer 24' does not comprise a gate, it may comprise other circuit means such as a conductor, a capacitor, a resistor or a semiconductor circuit per se.

As another example of the present invention the layer 14 may comprise a titanium or a tantalum layer and the layer 18 may comprise tin, gold, palladium or silver. The titanium or tantalum will there after be converted in the region 16 to a compound such as titanium dioxide or tantalum oxide by anodization or oxidation through the opening 20 in the tin, palladium, gold or silver layer after which the oxide may be removed by hydrogen fluoride.

Additionally, the tantalum oxide or the titanium dioxide may be removed by a plasma as previously defined herein. The layer 14 may also comprise an aluminum layer which may be converted into a compound comprising aluminum oxide which may be removed by a plasma or alternatively layer 14 may comprise a silicon layer which may be converted into a compound comprising silicon dioxide which is removed by hydrogen fluoride. Lastly, the layer 14 may comprise either silicon, tantalum, titanium, or hafnium all of which may be converted to compounds comprising their respective oxides and nitrides and the oxides and nitrides removed by a plasma.

Figure 4:
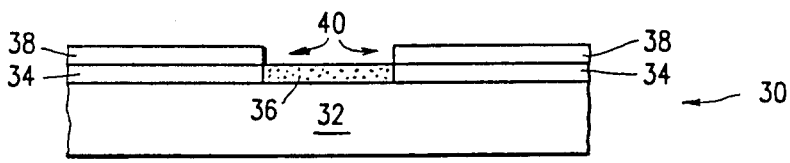
FIG. 4 comprises a side elevation in section of a wave guide device comprising a substrate having a first and a second layer thereon, the second layer having an opening through which the first layer is chemically reacted in the region underneath the opening to form a compound having a different index of refraction from that of the first layer, the substrate over which the wave guide is fabricated comprising in some instances a semiconductor device known in the art.

The method of the present invention is also applicable to the formation of wave guides on semiconductor or other devices as illustrated by device 30 in FIG. 4 in which a layer 34 is placed on a substrate 32 such as silicon, etc. of a device 30 over which a layer 38 is also placed. An opening 40 is formed in the layer 38 in the same way as the opening 20 in the device illustrated in FIG. 2. The opening 40 in layer 38 extends downwardly to the first layer 34 and has the width and length of a wave guide. The layer 34 is then reacted through the opening 40 to convert layer 34 in a region below the opening 40 to a compound 36 conforming in size to the length and width of opening 40, compound 36 having a different index of refraction than layer 34. Layer 34 may comprise either germanium, aluminum, titanium or tantalum as a thin layer either of which may be converted through opening 40 to their respective oxide. The oxides of these metals have a different index of refraction than the metals from which they are formed. Layer 38 may comprise for example either tin, palladium, tungsten, or gold but may also comprise a photoresist layer which is subsequently removed so that an approximately planar surface is formed over which subsequent semiconductor device members may be placed such as conductors and insulators known in the art.

The self-aligned semiconductor devices as well as the wave guide devices of the present invention have application in any of the art known electronic circuits employing semiconductors or wave guide means.

In one embodiment, the substrate 32 may comprise a semiconductor device for the transmission and processing of information utilizing light as a signal transfer means. The substrate 32 may contain, for example, a semiconductor laser device as well. Where the device 30 is to receive light signals by means of fiber optic members operatively associated therewith the opening 40 can be arranged at one end of the device to extend for a width sufficient to receive such a signal from a fiber optic device and then narrow down or neck in to a width more consistent with the width of a wave guide on a microcircuit semiconductor device (other means are well known to those skilled in the art for coupling light from optical fibers into waveguide elements on semiconductor substrates). The increased width of opening 40 may also provide an area having a different index of refraction suitable for receiving laser signals for subsequent transmission through the device where the opening 40 subsequently is constricted so as to produce a wave guide of small dimensions suitable for a wave guide on a microcircuit semiconductor device. The wave guides as provided according to the present invention can also be employed for the interconnection of microcircuit chips where each of the chips have such wave guides in them. The wave guides can therefore be used in lieu of electrical conductors.

Although the invention has been described by reference to some preferred embodiments, it is not intended that the novel process for making self-aligned semiconductor devices or for the manufacture of wave guides as well as the devices themselves are to be limited thereby but that modifications thereof are intended to be included as falling within the broad spirit and scope of the attached drawings, the foregoing specification and the following claims.

Having thus described our invention, what we claim as new, and desire to secure by Letters Patent is:

1. In a method for the production of a self-aligned semiconductor device having an element on said device in a region adjacent to circuit means for the control of power through said device, the improvement comprising chemically controlling the alignment and proximity of said element next adjacent said circuit means by the steps comprising:
   (1) placing said element on a semiconductor substrate,
   (2) placing a layer on said element in a region over and adjacent to the area of placement of said circuit means on said substrate,
   (3) providing an opening in said layer extending over said region,
   (4) chemically converting said element below said opening and in a direction outwardly from said opening to a compound that is removable from said device by a reagent, said compound being removable from said substrate by said reagent at a rate faster than that of said element and layer,
   (5) controlling the conversion of said element to said compound for a distance extending under said layer and adjacent said opening in a direction substantially parallel to the plane of said substrate and within a predetermined distance from the edge of said opening,
   (6) after completion of said conversion, removing said compound by contacting said compound with said reagent,
   (7) depositing said circuit means through said opening.

2. The method of claim 1 where said reagent does not substantially remove said device, element and layer.

3. The method of claim 1 where said reagent comprises a solvent.

4. The method of claim 1 where said reagent comprises a plasma.

5. The method of claim 1 for the production of a self-aligned semiconductor device having a conductor on said device in a region adjacent gate means for the control of power through said device, the improvement comprising chemically controlling the alignment and proximity of said conductor adjacent said gate means by the steps comprising:
   (1) placing said conductor on said device,
   (2) placing a layer on said conductor in a region over and adjacent to the area of placement of said gate on said device,
   (3) providing an opening in said layer extending over said region,
   (4) chemically converting said conductor below said opening and in a direction outwardly from said opening to a compound that is removable from said device by a reagent, said compound being removable from said device by said reagent at a rate faster than that of said conductor and layer,
   (5) controlling the conversion of said conductor to said compound for a distance extending under said layer adjacent said opening in a direction substantially parallel to the plane of said device and within a predetermined distance from the edge of said opening,
   (6) after completion of said conversion removing said compound by contacting said compound with said reagent,
   (7) depositing said gate through said opening.

6. The method of claim 5 where said reagent does not substantially remove said device, element and layer.

7. The method of claim 5 where said reagent comprises a solvent.

8. The method of claim 5 where said reagent comprises a plasma.

9. The method of claim 5 comprising:
   (1) placing a germanium conductor on said device,
   (2) placing a layer on said germanium in a region over and adjacent to the area of placement of said gate on said device, said layer selected from a member of the group consisting of a gold, molybdenum, palladium or a tungsten layer,
   (3) providing an opening in said layer extending over said region,
   (4) chemically converting said germanium below said opening and in a direction outwardly from said opening to germanium oxide,
   (5) controlling the conversion of germanium to germanium oxide for a distance extending under said layer and adjacent said opening in a direction substantially parallel to the plane of said device and within a predetermined distance from the edge of said opening,
(6) after completion of said conversion, removing said germanium oxide through said opening by contacting said germanium oxide with a reagent that will remove said germanium oxide.

10. The method of claim 9 where said reagent is selected from a member of the group consisting of water and hydrochloric acid.

11. A method of claim 9 where said reagent comprises a plasma.

12. A method of claim 5 comprising:
(1) depositing a titanium conductor on said device,
(2) placing a layer on said titanium conductor in a region over and adjacent to the area of placement of said circuit means of said device, said layer selected from a member of the group consisting of a tin, palladium, gold or a silver layer,
(3) providing an opening in said layer extending over said region,
(4) chemically converting said titanium below said opening and in a direction outwardly from said opening to titanium dioxide,
(5) controlling the conversion of said titanium to said titanium dioxide for a distance extending under said layer and adjacent said opening in a direction substantially parallel to the plane of said device and within a predetermined distance form the edge of said opening,
(6) after completion of said conversion, removing said titanium dioxide through said opening by contacting said titanium dioxide with a reagent that will remove said titanium dioxide.

13. The method of claim 12 where said reagent comprises hydrogen fluoride.

14. The method of claim 5 comprising:
(1) depositing a tantalum conductor on said device,
(2) placing a layer on said tantalum in a region over and adjacent to the area of placement of said gate on said device, said layer selected from a member of the group consisting of a tin, palladium, gold or a silver layer,
(3) providing an opening in said layer extending over said region,
(4) chemically converting said tantalum below said opening and in a direction outwardly from said opening to tantalum oxide,
(5) controlling the conversion of said tantalum to said tantalum oxide for a distance extending under said layer and adjacent said opening in a direction substantially parallel to the plane of said device and within a predetermined distance form the edge of said opening,
(6) after completion of said conversion, removing the said tantalum oxide through said opening by contacting said tantalum oxide with a reagent that removes said tantalum oxide.

15. The method of claim 14 where said reagent comprises hydrogen fluoride.

* * * * *